US011067647B2

(12) United States Patent
Deak et al.

(10) Patent No.: US 11,067,647 B2
(45) Date of Patent: Jul. 20, 2021

(54) LOW-NOISE MAGNETORESISTIVE SENSOR HAVING MULTI-LAYER MAGNETIC MODULATION STRUCTURE

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 85 days.

(21) Appl. No.: 16/608,596

(22) PCT Filed: Apr. 25, 2018

(86) PCT No.: PCT/CN2018/084439
§ 371 (c)(1),
(2) Date: Oct. 25, 2019

(87) PCT Pub. No.: WO2018/196785
PCT Pub. Date: Nov. 1, 2018

(65) Prior Publication Data
US 2020/0142009 A1    May 7, 2020

(30) Foreign Application Priority Data
Apr. 26, 2017   (CN) .......................... 201710284467.7

(51) Int. Cl.
*G01R 33/09*    (2006.01)
(52) U.S. Cl.
CPC ................... *G01R 33/093* (2013.01)
(58) Field of Classification Search
CPC ................................................... G01R 33/093
See application file for complete search history.

(56) References Cited

U.S. PATENT DOCUMENTS 4,065,797 A * 12/1977 Nomura ................. G11B 5/332
                                                                 360/316
6,822,443 B1 * 11/2004 Dogaru ................. G01R 33/093
                                                                 324/235
(Continued)

FOREIGN PATENT DOCUMENTS

CN          101393962 A       3/2009
CN          101680740 A       3/2010
(Continued)

OTHER PUBLICATIONS

"International Application No. PCT/CN2018/084439, International Search Report and Written Opinion dated Jul. 6, 2018", (Jul. 6, 2018), 10 pgs.

*Primary Examiner* — Walter L Lindsay, Jr.
*Assistant Examiner* — Milton Gonzalez
(74) *Attorney, Agent, or Firm* — Schwegman Lundberg & Woessner, P.A.

(57) ABSTRACT

A low-noise magnetoresistive sensor includes a substrate and an array of magnetic modulation structures on the substrate. The structure includes upper and lower soft ferromagnetic layers and a conductive metal layer in the middle. The two ends of the structure are connected to form a two-port excitation coil. Adjacent structures have opposite current directions. A magnetoresistive sensing unit is located above or below and is centered in the gap between the structures. The sensitive direction of the sensing units is perpendicular to a long direction of the structures. An array of sensing units is electrically connected to form a magnetoresistive sensor, and the sensor is connected to the sensor bond pads. When measuring an external magnetic field, an excitation current is applied to the excitation coil, and the output of the voltage or current signal of the magnetoresis- (Continued)

tive sensor is demodulated to produce a low-noise voltage signal.

10 Claims, 12 Drawing Sheets

(56) References Cited

U.S. PATENT DOCUMENTS

| | | | |
|---|---|---|---|
| 7,098,655 B2 * | 8/2006 | Yamada | G01N 27/9006 324/235 |
| 2009/0073747 A1 | 3/2009 | Seigler | |
| 2010/0039106 A1 | 2/2010 | Edelstein | |
| 2010/0321014 A1 | 12/2010 | Butzmann | |

FOREIGN PATENT DOCUMENTS

| | | |
|---|---|---|
| CN | 107422283 A | 12/2017 |
| CN | 206863194 U | 1/2018 |
| WO | WO-2018196785 A1 | 11/2018 |

\* cited by examiner

LOW-NOISE MAGNETORESISTIVE SENSOR HAVING MULTI-LAYER MAGNETIC MODULATION STRUCTURE

PRIORITY CLAIM TO RELATED APPLICATIONS

This application is a U.S. national stage filing under 35 U.S.C. § 371 from International Application No. PCT/CN2018/084439, filed on 25 Apr. 2018, and published as WO2018/196785 on 1 Nov. 2018, which claims the benefit under 35 U.S.C. 119 to Chinese Application No. 201710284467.7, filed on 26 Apr. 2017, the benefit of priority of each of which is claimed herein, and which applications and publication are hereby incorporated herein by reference in their entirety.

TECHNICAL FIELD

The present invention relates to the field of magnetic sensors, and in particular, to a low-noise magnetoresistive sensor having a multi-layer magnetic modulation structure.

BACKGROUND

There is 1/f noise in a magnetoresistive sensor during normal use. Reducing the noise of the magnetoresistive sensor and developing a low-noise magnetoresistive sensor are of a great significance for improving accurate measurement of magnetic signals. In general, the magnetoresistive sensor has high 1/f noise at a low frequency, and mainly has thermal noise at a high frequency, where the noise energy density of the latter is much lower than that at the low frequency. Thus, a magnetic signal is selectively pre-modulated into a high-frequency magnetic field, then it is measured by the magnetoresistive sensor to output a high-frequency voltage signal, and the signal is demodulated for the purpose of moving the measurement of the magnetic signal from a low-frequency region to a high-frequency region, thereby reducing the energy density of the 1/f noise.

In prior art using MEMS technology, a vibrating soft ferromagnetic flux concentrator structure is machined on the surface of the magnetoresistive sensor, and the soft ferromagnetic flux concentrator is driven to vibrate periodically on the surface of the magnetoresistive sensor for modulating a static external magnetic field. This technology is conducive to reducing the 1/f noise of the magnetoresistive sensor; however, the complexity and size of the magnetoresistive sensor as well as the complexity of the process are increased greatly due to the addition of the vibration structure and a driver.

SUMMARY OF THE INVENTION

In order to solve the above problem, a low-noise magnetoresistive sensor having a multi-layer magnetic modulation structure is proposed in the present invention, comprising: a substrate and a multi-layer magnetic modulation structure array located on the substrate, wherein the multi-layer magnetic modulation structure array comprises a plurality of multi-layer magnetic modulation structures, the multi-layer magnetic modulation structure comprises a soft ferromagnetic layer, a conductive metal layer, and a soft ferromagnetic layer from top to bottom, the two ends of the multi-layer magnetic modulation structure are connected using conductive strips to form a two-port excitation coil, and the two-port excitation coil is connected to excitation coil bond pads, and adjacent multi-layer magnetic modulation structures have opposite current directions during operation;

a magnetoresistive sensing unit is located above or below the multi-layer magnetic modulation structures, and centered in the gap between the magnetic modulation structures, the sensitive direction of the magnetoresistive sensing units is perpendicular to the long direction of the multi-layer magnetic modulation structures, the magnetoresistive sensing unit array is electrically connected to form a magnetoresistive sensor, and the sensor is connected to the sensor bond pads; and when measuring an external magnetic field, an excitation current is applied to the excitation coil, and the output of the voltage or current signal of the magnetoresistive sensor is demodulated to produce a low-noise voltage signal.

Further, the multi-layer magnetic modulation structure array comprises 2N multi-layer magnetic modulation structures, and the magnetoresistive sensing unit array is located in N−1 gaps on two sides of the $N^{th}$ and $(N+1)^{th}$ multi-layer magnetic modulation structures;

or the multi-layer magnetic modulation structure array comprises 2N+1 multi-layer magnetic modulation structures, and the magnetoresistive sensing unit array is located in N gaps on two sides of the $(N+1)^{th}$ multi-layer magnetic modulation structure, wherein N is an integer greater than 0.

Further, an excitation current at a frequency f is applied to the excitation coil, and when the permeability of the soft ferromagnetic material is in a linear state as the excitation current changes, a useful signal output by the magnetoresistive sensor is at a frequency f; when the permeability of the soft ferromagnetic material is in a linear and saturated state as the excitation current value changes, the useful signal output by the magnetoresistive sensor is at a frequency 2f.

Further, the magnetoresistive sensor comprises a two-port excitation coil and a two-port magnetoresistive sensing unit array, wherein the two-port excitation coil and the two-port magnetoresistive sensing unit array are deposited on the same substrate;

or the magnetoresistive sensor comprises a two-port excitation coil and four two-port magnetoresistive sensing unit arrays, wherein two of the two-port magnetoresistive sensing unit arrays are deposited on the same substrate; slices of the two two-port magnetoresistive sensing unit arrays deposited on the same substrate are flipped by 180 degrees and bound to form a push-pull full-bridge magnetoresistive sensor, and two excitation coils are connected in series to form the same two-port excitation coil;

or the magnetoresistive sensor comprises a two-port excitation coil and two two-port magnetoresistive sensing unit arrays, wherein a slice of a two-port magnetoresistive sensing unit array deposited on a substrate is flipped by 180 degrees and bound to form a push-pull half-bridge magnetoresistive sensor, and respective excitation coils are connected in series to form the two-port excitation coil;

or the magnetoresistive sensor comprises a two-port excitation coil and four two-port magnetoresistive sensing unit arrays, four slices of one of the two-port magnetoresistive sensing unit arrays deposited on the same substrate are flipped pairwise by 180 degrees and bound to form a push-pull full-bridge magnetoresistive sensor, and respective excitation coils are connected in series to form the two-port excitation coil.

Further, the magnetoresistive sensor comprises a two-port excitation coil and four two-port magnetoresistive sensing unit arrays, the two-port excitation coil and the four two-port magnetoresistive sensing unit arrays are deposited on the same substrate, and two of the two-port magnetoresistive sensing unit arrays and the other two of the two-port magnetoresistive sensing unit arrays have opposite magnetic field sensitive directions and are electrically connected to form a single-chip push-pull full-bridge magnetoresistive sensor;

or the magnetoresistive sensor comprises a two-port excitation coil and two two-port magnetoresistive sensing unit arrays, and the two-port excitation coil and the two two-port magnetoresistive sensing unit arrays are deposited on the same substrate, wherein one of the two-port magnetoresistive sensing unit arrays and the other one of the two-port magnetoresistive sensing unit arrays have opposite magnetic field sensitive directions and are electrically connected to form a single-chip push-pull half-bridge magnetoresistive sensor.

Further, the magnetoresistive sensing unit is of a TMR, GMR, or AMR type.

Further, the conductive strip is of a single-layer conductive structure or a structure identical to the multi-layer magnetic modulation structure; the soft ferromagnetic material is a high-permeability soft ferromagnetic alloy comprising one or more elements of Fe, Co, and Ni, and an insulating layer is added between the soft ferromagnetic layer and the conductive metal layer.

Further, an intermediate layer of the multi-layer magnetic modulation structure is Cu with a thickness range of 1-10 μm, and the soft ferromagnetic layer is permalloy with a thickness range of 1-10 μm.

Further, the multi-layer magnetic modulation structure has a width in the range of 10-1000 μm, and the gap of the multi-layer magnetic modulation structures has a width in the range of 5-50 μm; and a ratio of the width of the multi-layer magnetic modulation structure to the gap is increased to increase an external magnetic field gain factor and reduce the noise.

Further, the frequency f of the excitation coil is in the range of 1-100 KHz; when the density of the excitation current is $1\times10^1$-$1\times10^{12}$ A/m$^2$, the frequency of the useful signal is a fundamental frequency f; and when the density of the excitation current is greater than $1\times10^{12}$ A/m$^2$, the frequency of the useful signal is a second harmonic frequency 2f.

Compared with the prior art, the low-noise magnetoresistive sensor having a multi-layer magnetic modulation structure provided in the present invention can effectively reduce the energy density of the 1/f noise and further improve the accuracy of measurement of the magnetic signals. The low-noise magnetoresistive sensor provides a simple process and a compact structure with high sensitivity, low noise, and small size.

BRIEF DESCRIPTION OF THE DRAWINGS

In order to illustrate the technical solution in embodiments of the present invention more clearly, the accompanying drawings to be used in the descriptions about the embodiments will be introduced briefly below. It is apparent that the accompanying drawings in the following descriptions are merely some embodiments of the present invention. Those of ordinary skill in the art can also obtain other accompanying drawings according to the accompanying drawings without creative efforts.

DETAILED DESCRIPTION

To make the objectives, technical solutions, and advantages of the embodiments of the present invention much clearer, the technical solutions in the embodiments of the present invention will be described clearly and completely below with reference to the accompanying drawings in the embodiments of the present invention. It is apparent that the described embodiments are some of rather than all the embodiments of the present invention.

The present invention will be described in detail below with reference to the accompanying drawings in combination with embodiments.

Embodiment 1

Figure 1:
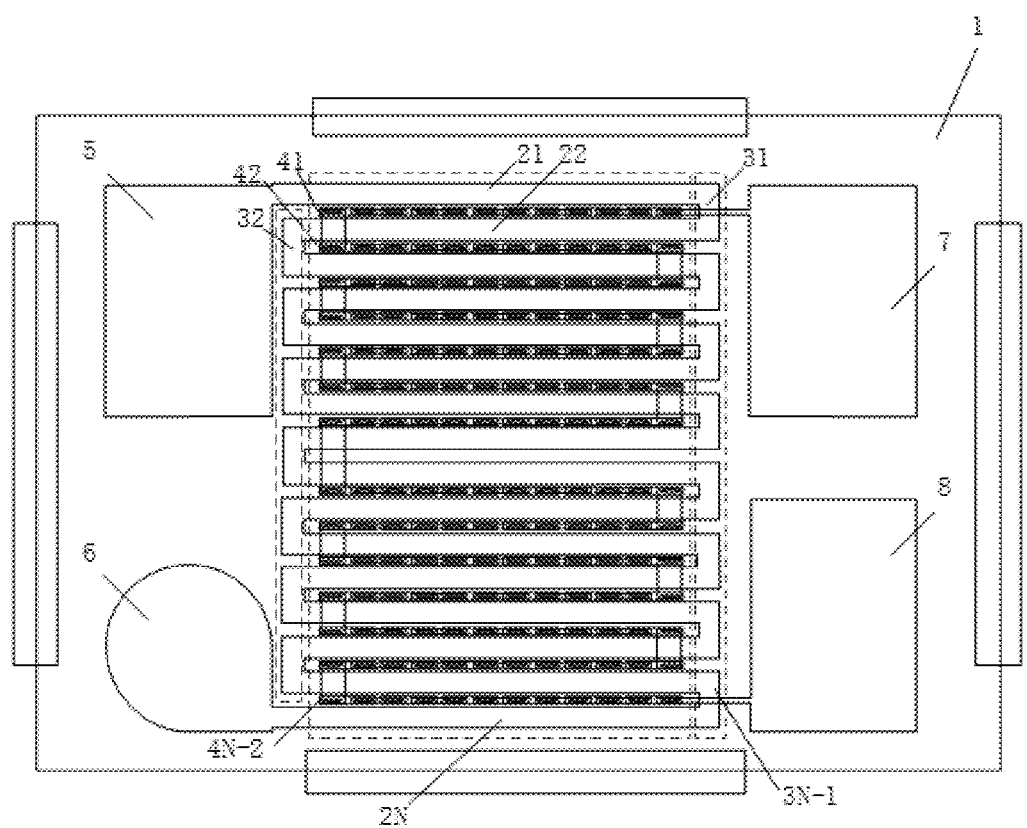
FIG. 1 is a slice structural diagram of a low-noise magnetoresistive sensor having a multi-layer magnetic modulation structure according to the present invention.

FIG. 1 is a slice structural diagram of a low-noise magnetoresistive sensor having a multi-layer magnetic modulation structure, including a substrate 1 and a multi-layer magnetic modulation structure array located on the substrate. The multi-layer magnetic modulation structure includes a plurality of multi-layer magnetic modulation structures, wherein 21, 22, . . . , 2N in FIG. 1 are the multi-layer magnetic modulation structures; and adjacent multi-layer magnetic modulation structures are connected using conductive strips 31, 32, . . . , 3N−1 to form a two-port excitation coil. The multi-layer magnetic modulation structure is connected to an excitation coil bond pad 5 and an excitation coil bond pad 6 at the same time as well as magnetoresistive sensing unit arrays 41, 42, . . . , 4N−2 between gaps of the multi-layer magnetic modulation structure array. The magnetoresistive sensing units are electrically connected to form a two-port magnetoresistive sensing unit array and are connected to a magnetoresistive sensor bond pad 7 and a magnetoresistive sensor bond pad 8. When N is an even number 2k (k is an integer greater than 0), the magnetoresistive sensing unit array is located in k−1 gaps on two sides of the $k^{th}$ and $(k+1)^{th}$ multi-layer magnetic modulation structures. When N is an odd number 2k+1 (k is an integer greater than 0), the magnetoresistive sensing unit array is located in k gaps on two sides of the $(k+1)^{th}$ multi-layer magnetic modulation structure. The magnetoresistive sensing unit in the present invention is of a TMR, GMR, or AMR type, and its magnetic field sensitive direction is perpendicular to a long direction or length direction of the multi-layer magnetic modulation structure.

Figure 2:
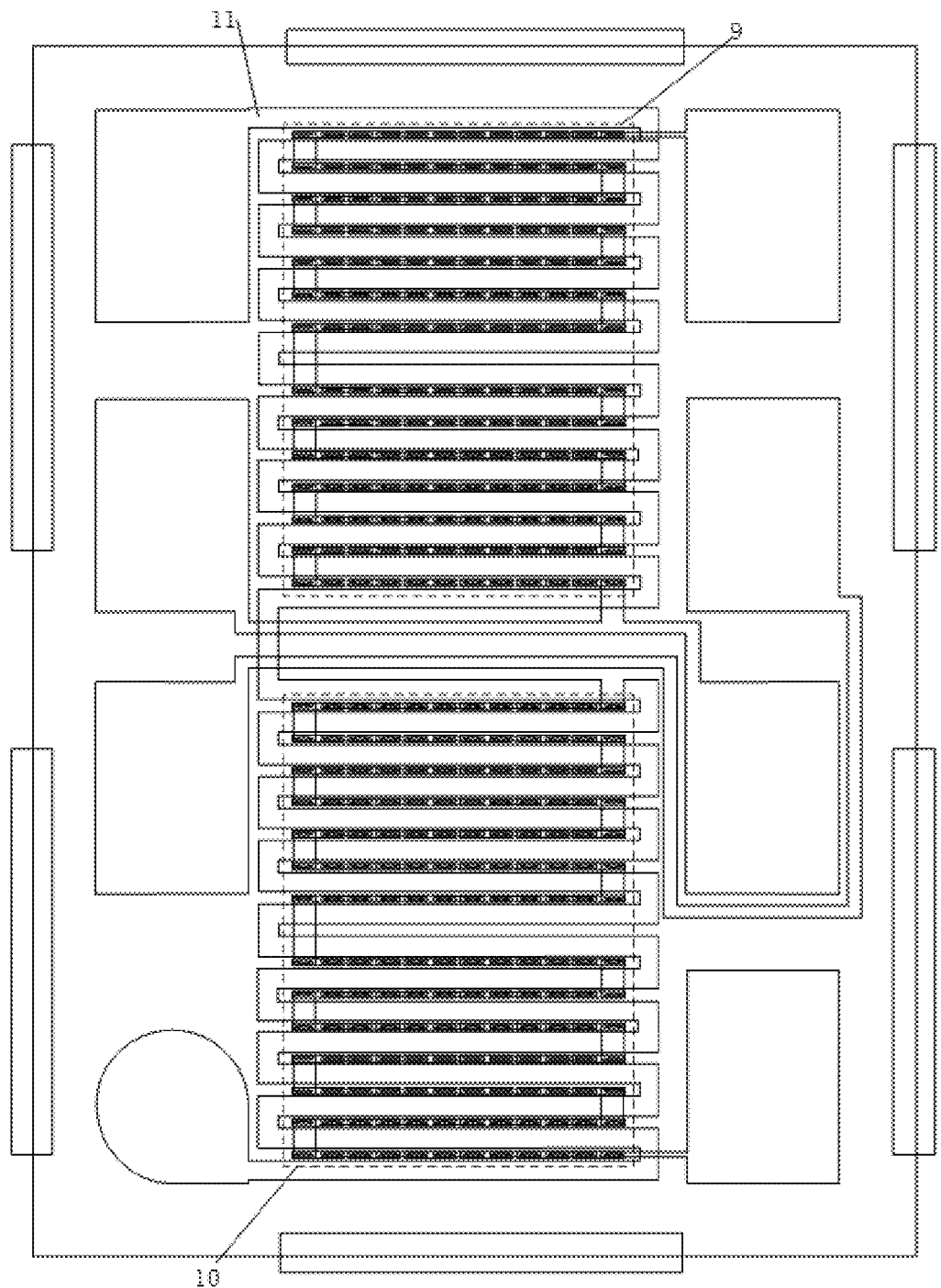
FIG. 2 is a slice structural diagram of another low-noise magnetoresistive sensor having a multi-layer magnetic modulation structure according to the present invention.

FIG. 2 is a slice structural diagram of another low-noise magnetoresistive sensor having a multi-layer magnetic modulation structure, including two two-port magnetoresistive sensing unit arrays and a two-port excitation coil 11 that are located on the same substrate, wherein 9 and 10 in FIG. 2 denote the two-port magnetoresistive sensors.

Figure 3:
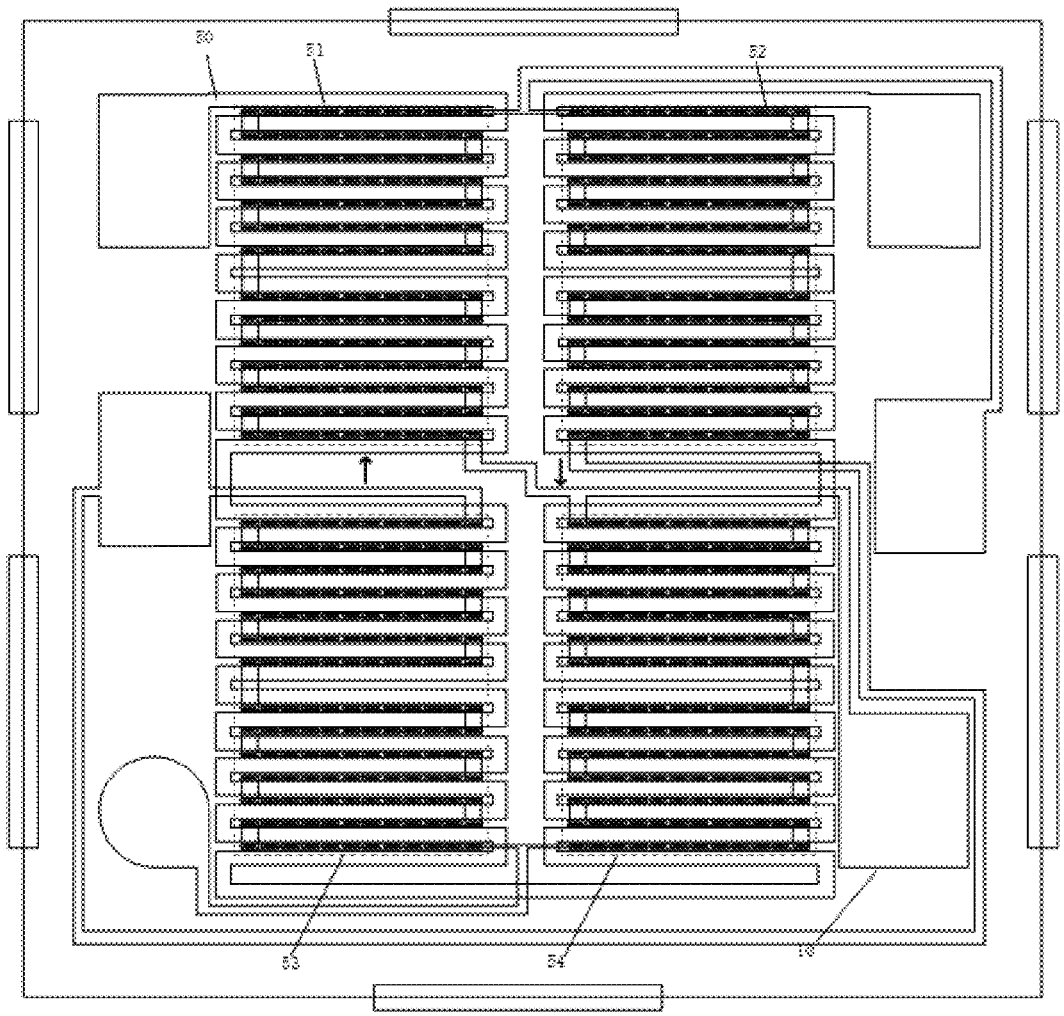
FIG. 3 is a slice structural diagram of another low-noise magnetoresistive sensor having a multi-layer magnetic modulation structure according to the present invention.

FIG. 3 is a slice structural diagram of another low-noise magnetoresistive sensor having a multi-layer magnetic modulation structure, including four two-port magnetoresistive sensing unit arrays located on the same substrate, for example, 51, 52, 53, and 54 in FIG. 3. The magnetoresistive sensing unit arrays 51, 52 and the magnetoresistive sensing unit arrays 53, 54 have opposite magnetic field sensitive directions and are electrically connected to form a push-pull full-bridge magnetoresistive sensor. A two-port excitation coil 50 is also shown in the slice structural diagram. It should be noted that in addition to the full-bridge, it may also include two two-port magnetoresistive sensing unit arrays located on the same substrate and having opposite magnetic field sensitive directions, which are electrically connected to form a push-pull half-bridge structure.

Figure 4A:
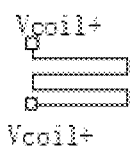
FIG. 4(a) is a structural diagram of an excitation coil in a low-noise magnetoresistive sensor having a multi-layer magnetic modulation structure according to the present invention.
Figure 4B:
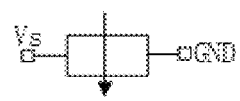
FIG. 4(b) is a structural diagram of a magnetoresistive sensing unit array in a low-noise magnetoresistive sensor having a multi-layer magnetic modulation structure according to the present invention.

In an electrical connection structural diagram of a low-noise magnetoresistive sensor having a multi-layer magnetic modulation structure, a two-port excitation coil and a two-port magnetoresistive sensing unit array are included. FIG. 4(a) is a structural diagram of an excitation coil in a low-noise magnetoresistive sensor having a multi-layer magnetic modulation structure according to the present invention. FIG. 4(b) is a structural diagram of a magnetoresistive sensing unit array in a low-noise magnetoresistive sensor having a multi-layer magnetic modulation structure according to the present invention. In this case, the two-port magnetoresistive sensing unit array can operate at a constant voltage to demodulate the current or operate at a constant current to demodulate the voltage.

Figure 5A:
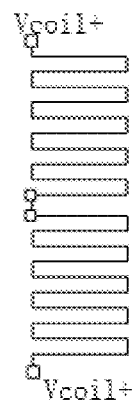
FIG. 5(a) is a structural diagram of an excitation coil in another low-noise magnetoresistive sensor having a multi-layer magnetic modulation structure according to the present invention.
Figure 5B:
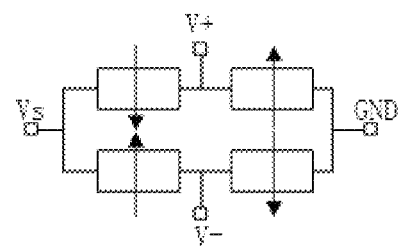
FIG. 5(b) is a structural diagram of a push-pull full-bridge magnetoresistive sensor in another low-noise magnetoresistive sensor having a multi-layer magnetic modulation structure according to the present invention.

In an electrical connection structural diagram of another low-noise magnetoresistive sensor having a multi-layer magnetic modulation structure, a two-port excitation coil and a push-pull full-bridge magnetoresistive sensor are included. FIG. 5(a) is a structural diagram of an excitation coil in another low-noise magnetoresistive sensor having a multi-layer magnetic modulation structure according to the present invention. FIG. 5(b) is a structural diagram of a push-pull full-bridge magnetoresistive sensor in another low-noise magnetoresistive sensor having a multi-layer magnetic modulation structure according to the present invention. Specifically, four two-port bridge arms of the full-bridge can be obtained by flipping four slice structures as shown in FIG. 1 by 180 degrees, and in this case, the two-port excitation coil is formed by connecting two-port excitation coils on the four slices in series. Alternatively, the four two-port bridge arms of the full-bridge can be obtained by flipping two slice structures as shown in FIG. 2 by 180 degrees, and in this case, the two-port excitation coil is formed by connecting two-port excitation coils on the two slices in series. Also, the four two-port bridge arms of the full-bridge can be obtained by directly electrically connecting four two-port magnetoresistive sensors located on the same single chip and having opposite magnetic field sensitive directions in pairs, and in this case, the two-port excitation coils are connected in series to form a two-port structure.

Figure 6A:
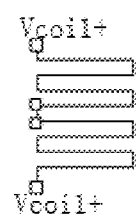
FIG. 6(a) is a structural diagram of an excitation coil in another low-noise magnetoresistive sensor having a multi-layer magnetic modulation structure according to the present invention.
Figure 6B:
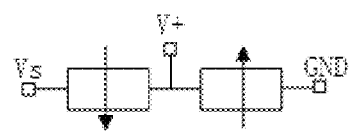
FIG. 6(b) is a structural diagram of a push-pull half-bridge magnetoresistive sensor in another low-noise magnetoresistive sensor having a multi-layer magnetic modulation structure according to the present invention.

In an electrical connection structural diagram of another low-noise magnetoresistive sensor having a multi-layer magnetic modulation structure, a two-port excitation coil and a push-pull half-bridge magnetoresistive sensor are included. FIG. 6(a) is a structural diagram of an excitation coil in another low-noise magnetoresistive sensor having a multi-layer magnetic modulation structure according to the present invention. FIG. 6(b) is a structural diagram of a push-pull half-bridge magnetoresistive sensor in another low-noise magnetoresistive sensor having a multi-layer magnetic modulation structure according to the present invention. Specifically, two two-port bridge arms of the half-bridge can be obtained by flipping two slice structures shown in FIG. 1, and in this case, the two-port excitation coil is formed by connecting two-port excitation coils on the two slices in series. Also, the two two-port bridge arms of the half-bridge can be obtained by directly electrically connecting two two-port magnetoresistive sensors located on the same single chip and having opposite magnetic field sensitive directions, and in this case, the two-port excitation coils are connected in series to form a two-port structure.

Figure 7:
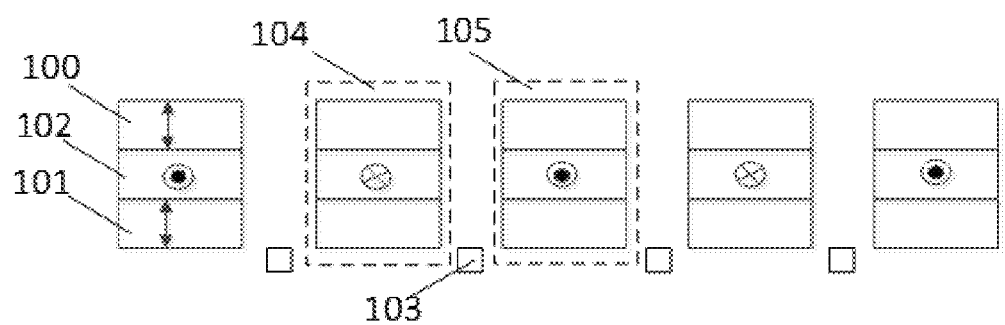
FIG. 7 is a layer position diagram of a multi-layer magnetic modulation structure array and a magnetoresistive sensing unit array according to the present invention.

FIG. 7 is a layer position diagram of a multi-layer magnetic modulation structure array and a magnetoresistive sensing unit array. The multi-layer magnetic modulation structure includes two ferromagnetic layers, an upper layer and a lower layer, each of which is comprised of a soft ferromagnetic material, and a conductive metal layer 102 in the middle. The soft ferromagnetic layers are 100 and 101 in FIG. 7. The magnetoresistive sensing unit 103 is located above or below the multi-layer magnetic modulation structures and centered in the gap between the magnetic modulation structures. Adjacent multi-layer magnetic modulation structures 104 and 105 have opposite current directions. The current flows in through the conductive metal layer 102 in the middle, and the conductive metal layer 102 in the middle and the upper and lower soft ferromagnetic layers are isolated by insulating layers.

Figure 8A:
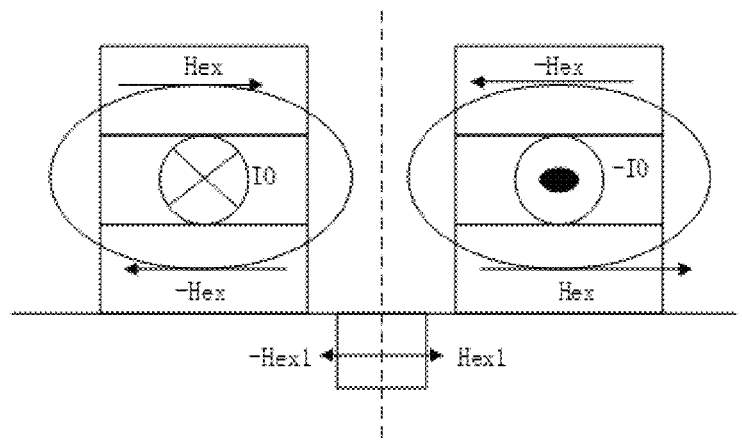
FIG. 8(a) is a distribution diagram of an excitation magnetic field of two adjacent multi-layer magnetic modulation structures in the absence of an external magnetic field according to the present invention.
Figure 8B:
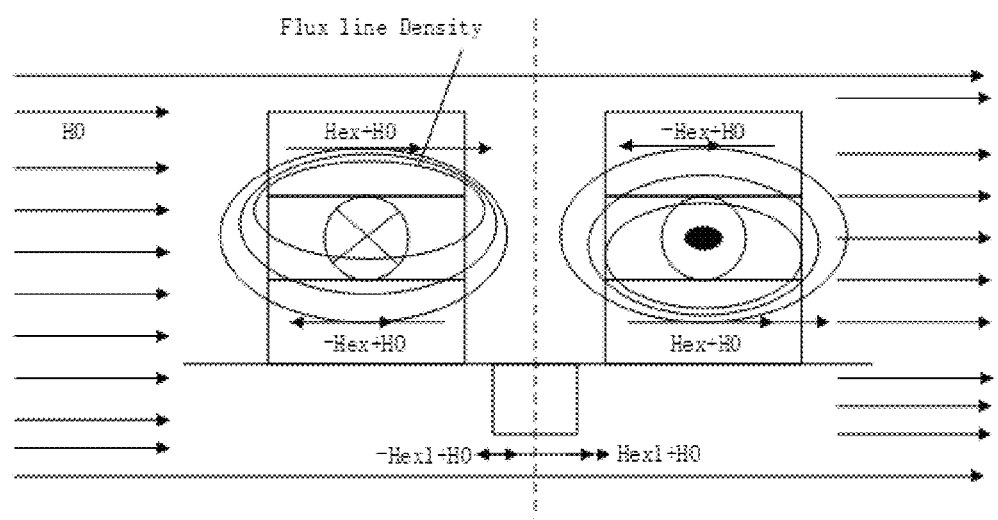
FIG. 8(b) is a distribution diagram of an excitation magnetic field of multi-layer magnetic modulation structures under the action of an external magnetic field H0 according to the present invention.

FIG. 8(a) is a distribution diagram of an excitation magnetic field of two adjacent multi-layer magnetic modulation structures in the absence of an external magnetic field. Since excitation currents of the two adjacent multi-layer magnetic modulation structures are distributed as I0 and −I0 and the magnetoresistive sensor is located in the center, an excitation magnetic field produced at the upper soft ferromagnetic layer by I0 is Hex(ft), and an excitation magnetic field produced at the lower soft ferromagnetic layer is −Hex(ft); and an excitation magnetic field produced at the upper soft ferromagnetic layer by −I0 is −Hex(ft), and an excitation magnetic field produced at the lower soft ferromagnetic layer is Hex(ft). Then, excitation magnetic fields produced at the magnetoresistive sensing units are Hex1(ft) and −Hex1(ft) respectively, which are identical in size and opposite in direction and thus cancel out each other. FIG. 8(b) is a distribution diagram of an excitation magnetic field of two adjacent multi-layer magnetic modulation structures under the action of an external magnetic field H0. In this case, the magnetic field strength in the upper and lower soft ferromagnetic layers of the multi-layer magnetic modulation structure is changed, that is, the strength of the magnetic field in a direction the same as that of the external magnetic field is increased, which is Hex(ft)+H0; and the strength of the magnetic field in a direction opposite to that of the external magnetic field is decreased, which is −Hex(ft)+H0. In addition, due to the introduction of H0, permeability states of the upper and lower soft ferromagnetic layers are different, and magnetic fields produced at the magnetoresistive sensing units by the left and right multi-layer magnetic modulation structures are Hex1(ft)+H0 and −Hex1(ft)+H0, respectively. Therefore, the change of the magnetic field strength at the magnetoresistive sensing units is related to the external magnetic field strength H0 and the excitation magnetic field strength Hex(ft) at the upper and lower soft ferromagnetic layers of the multi-layer magnetic modulation structure, and the excitation magnetic field strength Hex(ft) is directly related to the excitation current I0. When I0 is large, the permeability of the soft ferromagnetic layers will change in a linear region and a saturation region. When I0 is small, the permeability of the soft ferromagnetic layers will change completely in the range of the linear region. Therefore, the low-noise magnetoresistive sensor pre-modulated by a multi-layer magnetic modulation structure is actually a fluxgate sensor with the difference that the magnetoresistive sensor is used in place of a secondary coil for collecting signals.

Figure 9:
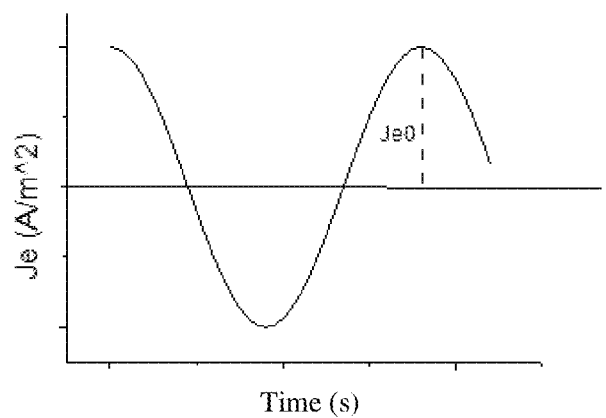
FIG. 9 shows a current waveform of an excitation coil in a low-noise magnetoresistive sensor pre-modulated by a multi-layer magnetic modulation structure according to the present invention.
Figure 10:
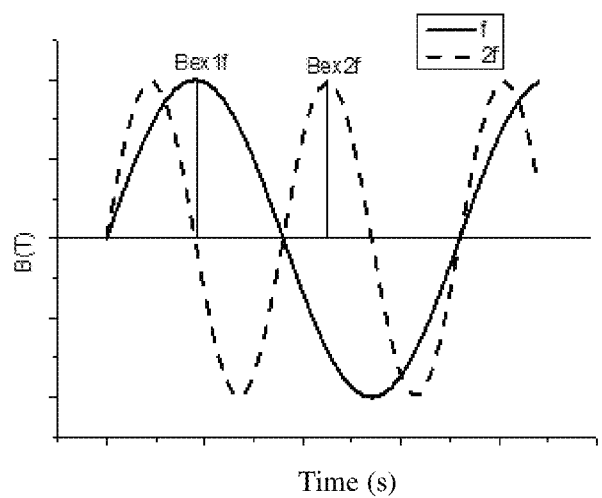
FIG. 10 shows a waveform of an output signal in a low-noise magnetoresistive sensor pre-modulated by a multi-layer magnetic modulation structure according to the present invention.

Thus, the discussion on the relationship between the excitation current I0, the external magnetic field H0, and the permeability of the soft ferromagnetic layer from the perspective of fluxgate principle directly determines the pattern and performance of an output signal of the magnetoresistive sensor. FIG. 9 shows a current waveform of an excitation coil at a frequency f when the current density amplitude is Je0. FIG. 10 shows a magnetic-field measurement signal at the position of the magnetoresistive sensor. When the permeability is in the linear region, the magnetic induction intensity at the position of the magnetoresistive sensor also has the output characteristic at a frequency f. On the other hand, when the amplitude of the excitation current is large enough to cause the permeability in the linear region and the saturation region, it can be known according to the fluxgate principle that second harmonic 2f signals are output in this case, and the magnetic field signal amplitudes Bex1f and Bex2f are directly proportional to the measured magnetic field strength H0.

In order to obtain the optimal design of the soft ferromagnetic strip array of the multi-layer magnetic modulation structure, the thickness of the soft ferromagnetic layer, the thickness of the intermediate conductive layer, the strip width and the gap size of the soft ferromagnetic strip array of the multi-layer magnetic modulation structure will be optimized according to the magnitude and variation rule of the magnetic field gain factor. Discussion will be made by taking the operation in a primary fundamental state as an example, which is also applicable to the second harmonic operating state.

It should be noted that the conductive strip in the present invention is of a single-layer conductive structure or a structure identical to the multi-layer magnetic modulation structure, the soft ferromagnetic material is a high-permeability soft ferromagnetic alloy that includes one or more elements of Fe, Co, and Ni, and an insulating layer may be added between the soft ferromagnetic layer and the conductive metal layer.

The magnetic field gain factor is defined as: G=Bex1f/(u0*H0). In the case of actual simulation, the magnetic field gain factor is calculated by setting the external magnetic field amplitude H0 within the range of 1-9 G and scanning the current density amplitude Je0 at a frequency f at the same time, thus measuring design parameters of the multi-layer magnetic modulation structure array.

Figure 11:
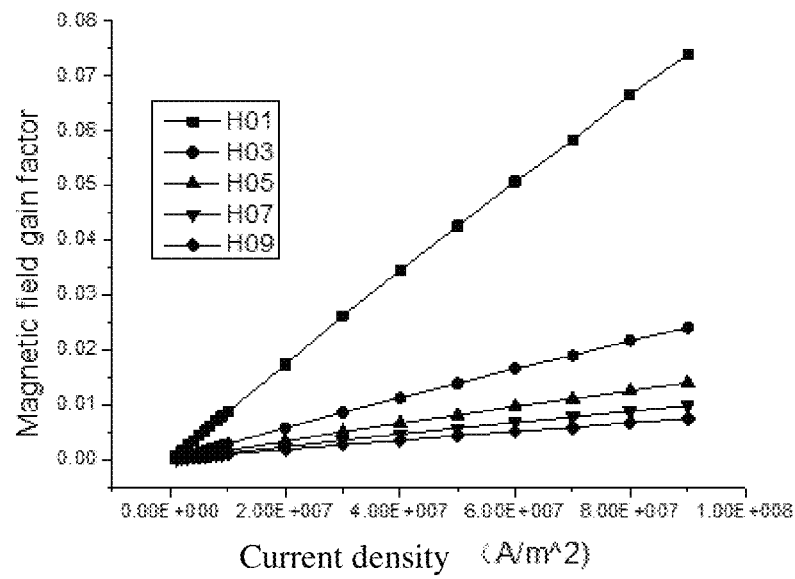
FIG. 11 is a typical curve of field gain factor vs. current density according to the present invention.

FIG. 11 is a typical curve of gain factor vs. current density. External magnetic fields are H01, H03, H05, H07, and H09. The current density varies within the range of 0-1×10$^8$ A/m$^2$. As can be seen from the figure, the magnetic field gain factor is linear, which is decreased with the increase of the external magnetic field and increased with the increase of the current density.

Figure 12:
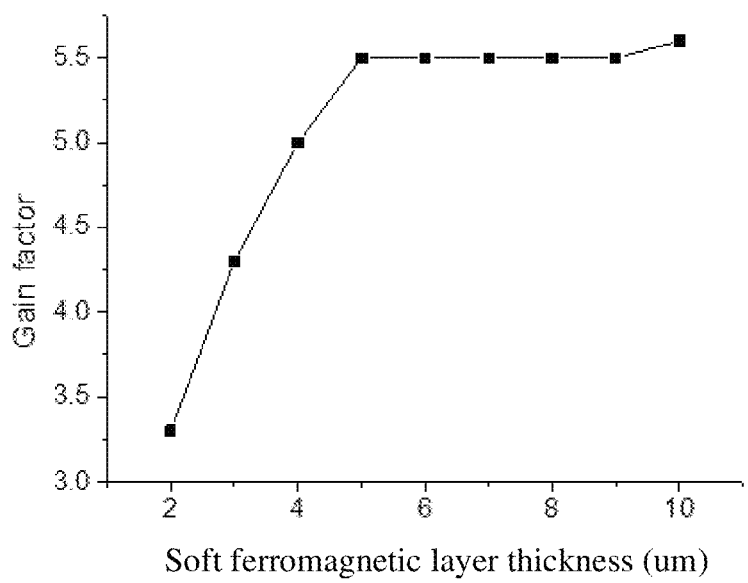
FIG. 12 shows the variation of a gain factor with the thickness of a soft ferromagnetic layer according to the present invention.
Figure 13:
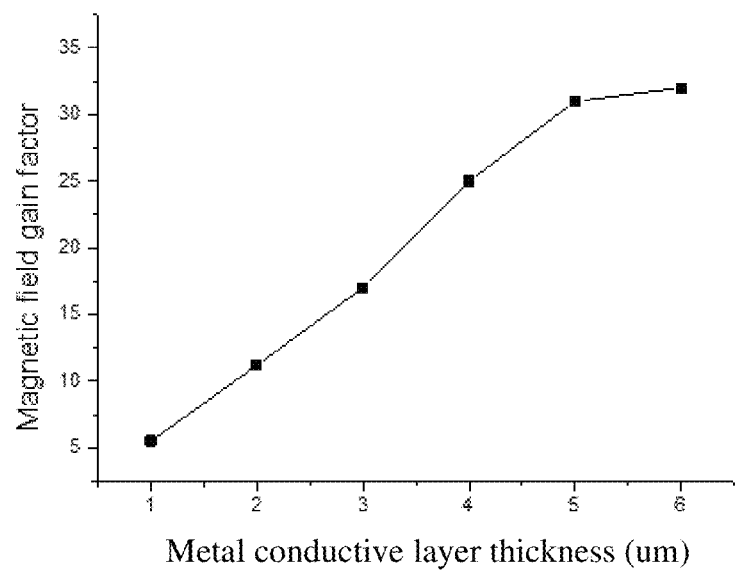
FIG. 13 shows the variation of a gain factor with the thickness of a conductive metal layer according to the present invention.
Figure 14:
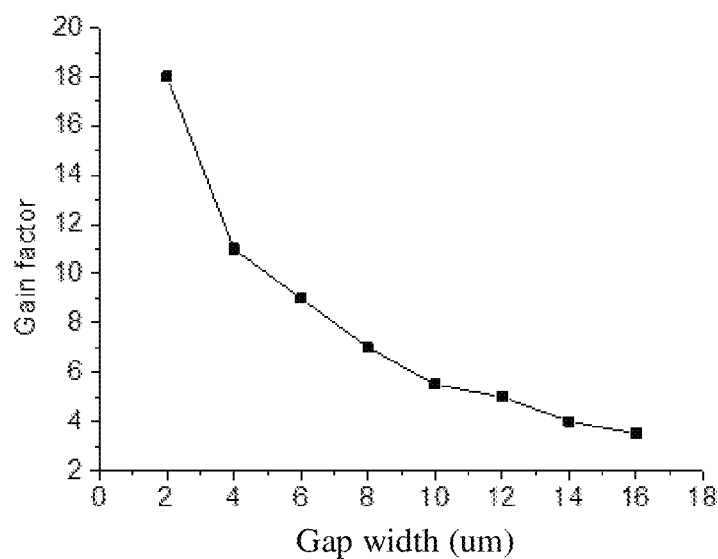
FIG. 14 shows the variation of a gain factor with the gap of a conductive layer according to the present invention.
Figure 15:
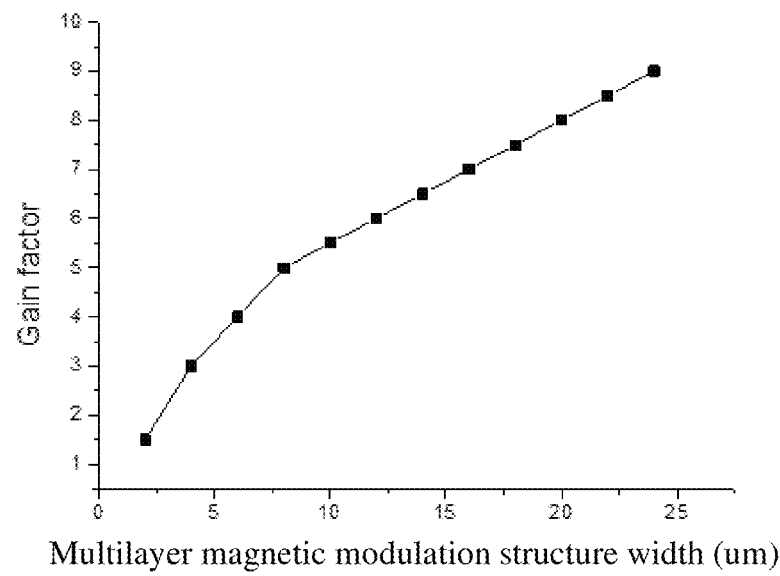
FIG. 15 shows the variation of a gain factor with the width of a conductive layer strip according to the present invention.
Figure 16:
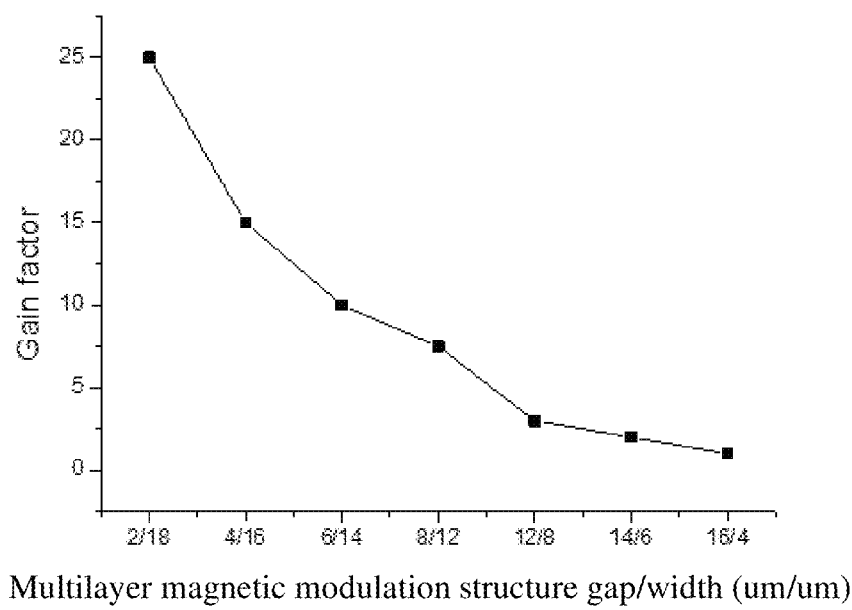
FIG. 16 shows the variation of a gain factor with the gap/width of a conductive layer strip according to the present invention.

FIG. 12 shows the variation of a gain factor with the thickness of a soft ferromagnetic layer when the current density is within the range of 0-1×10$^{10}$ A/m$^2$. As can be seen, when the thickness of the soft ferromagnetic layer is increased to 5 µm, its gain factor reaches the maximum value. If the thickness is increased continuously, the gain factor is not increased much. FIG. 13 shows the variation of a gain factor with the thickness of a conductive metal layer. As can be seen, the magnetic field gain factor is increased gradually as the thickness of the conductive metal layer is increased. However, when the thickness of the conductive metal layer is 5 µm, the increase trend slows down. FIG. 14 shows the variation of a gain factor with the width of a gap. As can be seen, the gain factor is decreased as the width of the gap is increased. The gap is a gap between the multi-layer magnetic modulation structures. FIG. 15 shows the variation of a gain factor with the width of the multi-layer magnetic modulation structure. As can be seen, the gain factor is decreased as the width of the multi-layer magnetic modulation structure is increased. FIG. 16 shows the variation of a gain factor with a ratio of the gap to the width of the multi-layer magnetic modulation structure. As can be seen, the gain factor is decreased as the ratio is increased. The gap is a gap between the multi-layer magnetic modulation structures.

In conclusion, the low-noise magnetoresistive sensor having a multi-layer magnetic modulation structure provided in the present invention can effectively reduce the energy density of the 1/f noise and further improve the accuracy of measurement of the magnetic signals. The low-noise magnetoresistive sensor provides a simple process and a compact structure with high sensitivity, low noise, and small size.

The above description is only preferred implementations of the present invention. Based on the embodiments of the present invention, all other embodiments obtained by those of ordinary skill in the art without creative efforts should fall within the protection scope of the present invention. It should be noted that several improvements and modifications can also be made by those of ordinary skill in the art without departing from the principle of the present invention. These improvements and modifications shall also be regarded as the protection scope of the present invention.

The invention claimed is:

1. A low-noise magnetoresistive sensor having a multi-layer magnetic modulation structure, the low-noise magnetoresistive sensor comprising:
a substrate; and
a multi-layer magnetic modulation structure array located on the substrate,
wherein the multi-layer magnetic modulation structure array comprises a plurality of multi-layer magnetic modulation structures,
wherein the multi-layer magnetic modulation structure comprises a soft ferromagnetic layer, a conductive metal layer, and a soft ferromagnetic layer from top to bottom, the two ends of the multi-layer magnetic modulation structure are connected using conductive strips to form a two-port excitation coil, and the two-port excitation coil is connected to excitation coil bond pads, and adjacent multi-layer magnetic modulation structures have opposite current directions during operation;
wherein a magnetoresistive sensing unit is located above or below the multi-layer magnetic modulation structures, and centered in the gap between the magnetic modulation structures, the sensitive direction of the magnetoresistive sensing units is perpendicular to the long direction of the multi-layer magnetic modulation structures, the magnetoresistive sensing unit array is electrically connected to form a magnetoresistive sensor, and the sensor is connected to the sensor bond pads; and
wherein, when measuring an external magnetic field, an excitation current is applied to the excitation coil, and the output of the voltage or current signal of the magnetoresistive sensor is demodulated to produce a low-noise voltage signal.

2. The low-noise magnetoresistive sensor comprised of a multi-layer magnetic modulation structure according to claim 1, wherein the multi-layer magnetic modulation structure array comprises 2N multi-layer magnetic modulation structures, and the magnetoresistive sensing unit array is located in N−1 gaps on two sides of the $N^{th}$ and $(N+1)^{th}$ multi-layer magnetic modulation structures;
or the multi-layer magnetic modulation structure array comprises 2N+1 multi-layer magnetic modulation structures, and the magnetoresistive sensing unit array is located in N gaps on two sides of the $(N+1)^{th}$ multi-layer magnetic modulation structure, wherein N is an integer greater than 0.

3. The low-noise magnetoresistive sensor comprised of a multi-layer magnetic modulation structure according to claim 1, wherein an excitation current at a frequency f is applied to the excitation coil, and when the permeability of the soft ferromagnetic material is in a linear state as the excitation current changes, a useful signal output by the magnetoresistive sensor is at a frequency f; when the permeability of the soft ferromagnetic material is in a linear and saturated state as the excitation current value changes, the useful signal output by the magnetoresistive sensor is at a frequency 2f.

4. The low-noise magnetoresistive sensor comprised of a multi-layer magnetic modulation structure according to claim 3, wherein the frequency f of the excitation coil is in the range of 1-100 KHz; when the density of the excitation current is $1\times10^1$-$1\times10^{12}$ A/m$^2$, the frequency of the useful signal is a fundamental frequency f; and when the density of the excitation current is greater than $1\times10^{12}$ A/m$^2$, the frequency of the useful signal is a second harmonic frequency 2f.

5. The low-noise magnetoresistive sensor comprised of a multi-layer magnetic modulation structure according to claim 1, wherein
the magnetoresistive sensor comprises a two-port excitation coil and a two-port magnetoresistive sensing unit array, wherein the two-port excitation coil and the two-port magnetoresistive sensing unit array are deposited on the same substrate;
or the magnetoresistive sensor comprises a two-port excitation coil and four two-port magnetoresistive sensing unit arrays, wherein two of the two-port magnetoresistive sensing unit arrays are deposited on the same substrate; slices of the two two-port magnetoresistive sensing unit arrays deposited on the same substrate are flipped by 180 degrees and bound to form a push-pull full-bridge magnetoresistive sensor, and two excitation coils are connected in series to form the same two-port excitation coil;
or the magnetoresistive sensor comprises a two-port excitation coil and two two-port magnetoresistive sensing unit arrays, wherein a slice of a two-port magnetoresistive sensing unit array deposited on a substrate is flipped by 180 degrees and bound to form a push-pull half-bridge magnetoresistive sensor, and respective excitation coils are connected in series to form the two-port excitation coil;
or the magnetoresistive sensor comprises a two-port excitation coil and four two-port magnetoresistive sensing unit arrays, four slices of one of the two-port magnetoresistive sensing unit arrays deposited on the same substrate are flipped pairwise by 180 degrees and bound to form a push-pull full-bridge magnetoresistive sensor, and respective excitation coils are connected in series to form the two-port excitation coil.

6. The low-noise magnetoresistive sensor comprised of a multi-layer magnetic modulation structure according to claim 1, wherein
the magnetoresistive sensor comprises a two-port excitation coil and four two-port magnetoresistive sensing unit arrays, the two-port excitation coil and the four two-port magnetoresistive sensing unit arrays are deposited on the same substrate, and two of the two-port magnetoresistive sensing unit arrays and the other two of the two-port magnetoresistive sensing unit arrays have opposite magnetic field sensitive directions and are electrically connected to form a single-chip push-pull full-bridge magnetoresistive sensor;
or the magnetoresistive sensor comprises a two-port excitation coil and two two-port magnetoresistive sensing unit arrays, and the two-port excitation coil and the two two-port magnetoresistive sensing unit arrays are deposited on the same substrate, wherein one of the two-port magnetoresistive sensing unit arrays and the other one of the two-port magnetoresistive sensing unit arrays have opposite magnetic field sensitive directions and are electrically connected to form a single-chip push-pull half-bridge magnetoresistive sensor.

7. The low-noise magnetoresistive sensor comprised of a multi-layer magnetic modulation structure according to claim 1, wherein the magnetoresistive sensing unit is of a TMR, GMR, or AMR type.

8. The low-noise magnetoresistive sensor comprised of a multi-layer magnetic modulation structure according to claim 1, wherein the conductive strip is of a single-layer conductive structure or a structure identical to the multi-layer magnetic modulation structure; the soft ferromagnetic material is a high-permeability soft ferromagnetic alloy comprising one or more elements of Fe, Co, and Ni, and an insulating layer is added between the soft ferromagnetic layer and the conductive metal layer.

9. The low-noise magnetoresistive sensor comprised of a multi-layer magnetic modulation structure according to claim 8, wherein an intermediate layer of the multi-layer magnetic modulation structure is Cu with a thickness range of 1-10 μm, and the soft ferromagnetic layer is a permalloy with a thickness range of 1-10 μm.

10. The low-noise magnetoresistive sensor comprised of a multi-layer magnetic modulation structure according to claim 8, wherein the multi-layer magnetic modulation structure has a width range of 10-1000 μm, and the gap of the multi-layer magnetic modulation structures has a width range of 5-50 μm; and a ratio of the width of the multi-layer magnetic modulation structure to the gap is increased to increase an external magnetic field gain factor and reduce the noise.

* * * * *

UNITED STATES PATENT AND TRADEMARK OFFICE
CERTIFICATE OF CORRECTION

PATENT NO. : 11,067,647 B2
APPLICATION NO. : 16/608596
DATED : July 20, 2021
INVENTOR(S) : Deak et al.

Page 1 of 1

It is certified that error appears in the above-identified patent and that said Letters Patent is hereby corrected as shown below:

In the Claims

In Column 10, Line 29, in Claim 5, delete "substrate;" and insert --substrate,-- therefor In Column 11, Line 16, in Claim 8, delete "substrate;" and insert --substrate,-- therefor Signed and Sealed this
Twenty-sixth Day of October, 2021

Drew Hirshfeld
*Performing the Functions and Duties of the*
*Under Secretary of Commerce for Intellectual Property and*
*Director of the United States Patent and Trademark Office*